United States Patent
Bareham et al.

(10) Patent No.: US 10,882,305 B2
(45) Date of Patent: Jan. 5, 2021

(54) ISOLATED PASTE DISPENSER

(71) Applicant: ASM Assembly Systems Singapore Pte. Ltd., Singapore (SG)

(72) Inventors: George Bareham, Weymouth (GB); Grant Wright, Merriott (GB); Simon Stuart Pape, Yeovil (GB)

(73) Assignee: ASM ASSEMBLY SYSTEMS SINGAPORE PTE. LTD., Singapore (SG)

(*) Notice: Subject to any disclaimer, the term of this patent is extended or adjusted under 35 U.S.C. 154(b) by 65 days.

(21) Appl. No.: 16/180,656

(22) Filed: Nov. 5, 2018

(65) Prior Publication Data

US 2019/0143668 A1  May 16, 2019

(30) Foreign Application Priority Data

Nov. 12, 2017 (GB) .................................. 1718674.3

(51) Int. Cl.
*B41F 15/40* (2006.01)
*B41F 15/34* (2006.01)
(Continued)

(52) U.S. Cl.
CPC .......... *B41F 15/34* (2013.01); *B41F 15/0813* (2013.01); *B41F 15/18* (2013.01);
(Continued)

(58) Field of Classification Search
CPC ...... B41F 15/34; B41F 15/08; B41F 15/0813; B41F 15/0818; B41F 15/0845; B41F 15/085; B41F 15/18; B41F 15/36; B41F 15/40; B41F 15/42; B41F 15/423; B41F 15/44; B41F 15/46; H05K 3/1216; H05K 3/1225; H05K 3/1233; B05C 5/02;
(Continued)

(56) References Cited

U.S. PATENT DOCUMENTS 5,332,439 A * 7/1994 Watanabe ............ H05K 3/4053
101/123
6,101,937 A * 8/2000 Murakami ............ B41F 15/085
101/114
(Continued)

FOREIGN PATENT DOCUMENTS

CN  103502010 A  1/2014
EP  1 491 343 A1  12/2004
(Continued)

OTHER PUBLICATIONS

Indian First Examination Report, dated Jun. 23, 2020, issued in corresponding Indian Patent Application No. 201824038812. Total 6 pages.

*Primary Examiner* — Leslie J Evanisko
(74) *Attorney, Agent, or Firm* — Ostrolenk Faber LLP

(57) ABSTRACT

A printing machine includes an isolated chamber for the print medium cartridge, which chamber can be opened and accessed without interrupting the print process. In order to enable such a configuration, the cartridge and its cradle are also separated from the print carriage and carried on a shuttle movably mounted on a static rail. The shuttle includes a wall section which acts to isolate the chamber when the shuttle is located in a home position within the chamber.

12 Claims, 6 Drawing Sheets

(51) Int. Cl.
*B41F 15/08* (2006.01)
*H05K 3/12* (2006.01)
*B41F 15/42* (2006.01)
*B41F 15/18* (2006.01)

(52) U.S. Cl.
CPC .............. *B41F 15/40* (2013.01); *B41F 15/42* (2013.01); *H05K 3/1216* (2013.01)

(58) Field of Classification Search
CPC ..... B05C 5/0212; B05C 5/022; B05C 5/0216; B05C 5/0287
USPC ..................... 101/126, 123, 129; 118/323
See application file for complete search history.

(56) References Cited

U.S. PATENT DOCUMENTS

| | | | |
|---|---|---|---|
| 6,328,415 B1 | 12/2001 | Norton | 347/37 |
| 8,322,279 B2 | 12/2012 | Demange | |
| 8,739,699 B2 | 6/2014 | Doyle | 101/123 |
| 9,352,547 B2 | 5/2016 | Kobayashi | |
| 2012/0145014 A1 | 6/2012 | Doyle | 101/126 |
| 2014/0366755 A1* | 12/2014 | Kobayashi | B41F 15/42 |
| | | | 101/127 |
| 2015/0367626 A1 | 12/2015 | Mantani | |

FOREIGN PATENT DOCUMENTS

| | | |
|---|---|---|
| FR | 2943634 A1 | 10/2010 |
| JP | 06166167 A * | 6/1994 |
| JP | 2006-272584 A | 10/2006 |
| JP | 2009-132047 A | 6/2009 |
| JP | 2010-194803 A | 9/2010 |
| JP | 2011016339 A * | 1/2011 |
| JP | 2014-240159 A | 12/2014 |
| JP | 2016-179579 A | 10/2016 |
| JP | 2018-118407 A | 8/2018 |
| KR | 20130137646 A | 12/2013 |
| KR | 20180092220 A | 8/2018 |
| WO | WO 2017/048905 A1 | 3/2017 |

* cited by examiner

ISOLATED PASTE DISPENSER

BACKGROUND AND PRIOR ART

Industrial screen-printing machines typically apply print media, such as solder paste or conductive ink, onto a planar workpiece, such as a wafer or circuit board, by applying the print medium (e.g. solder paste) through a pattern of apertures in a screen (sometimes referred to as a foil or a stencil) using an angled blade or squeegee. The print medium is conventionally stored in a cartridge or pot, and is dispensed from the bottom of this by applying pressure to the top, using a pressurised air source. The cartridge is mounted on the print carriage, which also carries the squeegee. Since the print carriage travels along the length (i.e. front to back) of the printing machine, conventionally referred to as the Y direction, the cartridge can dispense to either the front or rear rail of the printing machine. The cartridge is also mounted for movement along the X direction, being normal to the Y axis and in the horizontal plane, relative to the print carriage. In operation therefore, the print carriage is moved to one end of the printing machine, and the cartridge is caused to dispense print medium while travelling along the X direction, so that print medium is dispensed to form an approximately linear bead of medium onto the printing screen. Because of the lack of space available within the printing machine, the cartridge may be rotatable between a horizontal orientation when it is not dispensing, and a vertical orientation for dispensing.

The quantity of print medium present in the cartridge can be detected by a sensor, and an operator alerted when the cartridge requires replacement.

There is a problem however that in order to effect replacement of a cartridge, it is necessary to open up the printing machine to obtain access to the cartridge. FIG. 1 schematically shows a known printing machine 1 in a perspective view. The printing machine 1 is substantially cuboid, having an external housing 2 which covers the printing machine 1 to prevent unauthorised access to the interior of the printing machine 1. The housing is mounted on a frame (not visible in FIG. 1), which also supports internal machinery and components. A hood 3 is provided to enable authorised access. This is connected to the remainder of the housing 2 via a hinge 4, so that the hood 3 can be lifted up and rested on top of the housing. To further increase the safety of the printing machine 1, an interlocking system (not shown) may be provided, which must be enabled prior to opening the hood 3.

For safety reasons it is necessary that the printing operation is shut down whenever the hood 3 of the printing machine 1 is opened, including when opened for the purpose of replacing a cartridge. This means that the print cycle is interrupted every time a cartridge is changed, which adds time to, and decreases efficiency of, the print process.

The present invention seeks to overcome this problem.

In accordance with the present invention this aim is achieved by providing isolation for the print medium cartridge, such as an isolated chamber which can be opened and accessed without interrupting the print process. In order to enable such a configuration, the cartridge is also separated from the print carriage and carried on a static rail, fixed to the frame of the printing machine. While such an arrangement has the disadvantage that dispensing is only possible at one position, i.e. proximate the front or rear rail, it has been recognised that the advantages offered by this arrangement may outweigh the ability of conventional printing machines to dispense proximate both the front and rear rails of the printing machine.

SUMMARY OF THE INVENTION

In accordance with a first aspect of the present invention there is provided a printing machine for printing a print medium onto a workpiece, comprising:
a frame,
an external housing supported by the frame,
a receptacle for receiving a printing screen in use,
a rail extending at least partially across and over the receptacle,
a shuttle mounted for travel along the rail, and
a cradle adapted to retain a container for print medium, the cradle being mounted on the shuttle,
wherein the rail is statically fixed relative to the frame.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 2:
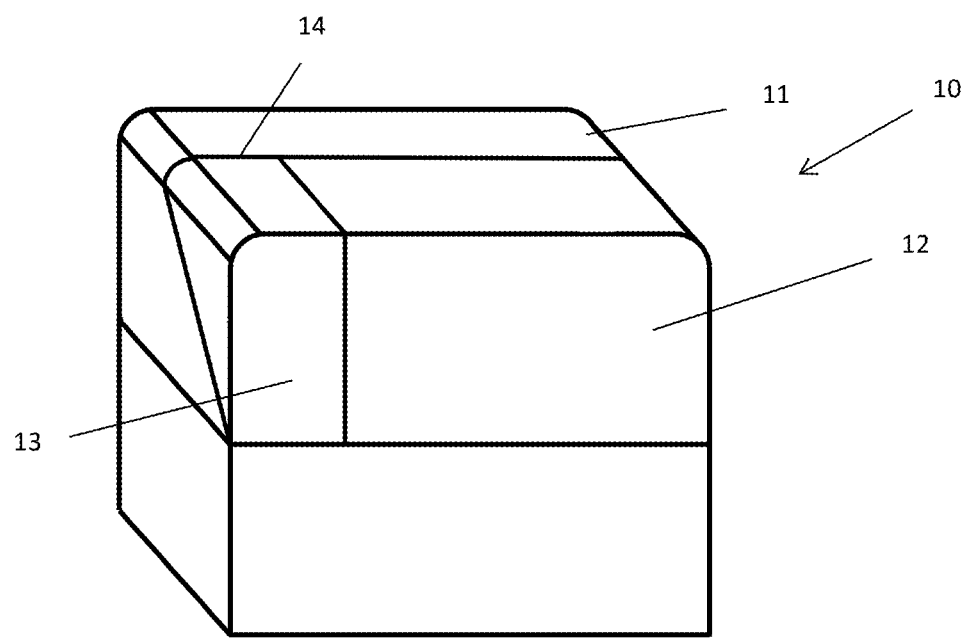
FIG. 2 schematically shows a perspective view of a closed printing machine in accordance with an embodiment of the present invention.

An embodiment of the present invention is schematically shown in FIG. 2. This shows a perspective view of a closed printing machine 10, with an external housing 11 supported on a frame (15, see FIG. 3). A hood 12 provides access the interior of the printing machine 10. In addition, a separate door 13 is provided, which may be opened by lifting it about a hinge 14 connecting the door 13 to the housing 11.

Figure 1:
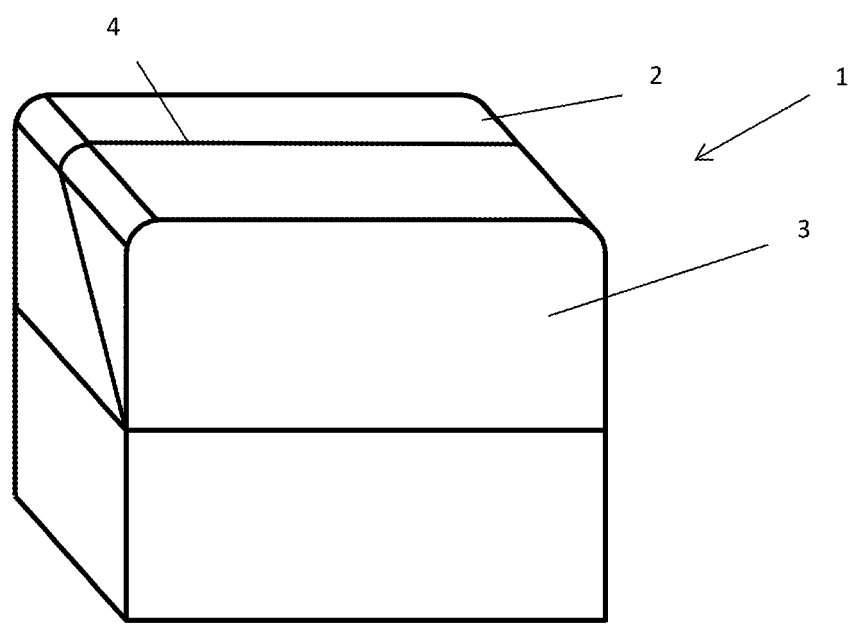
FIG. 1 schematically shows a perspective view of a closed, known printing machine.
Figure 3:
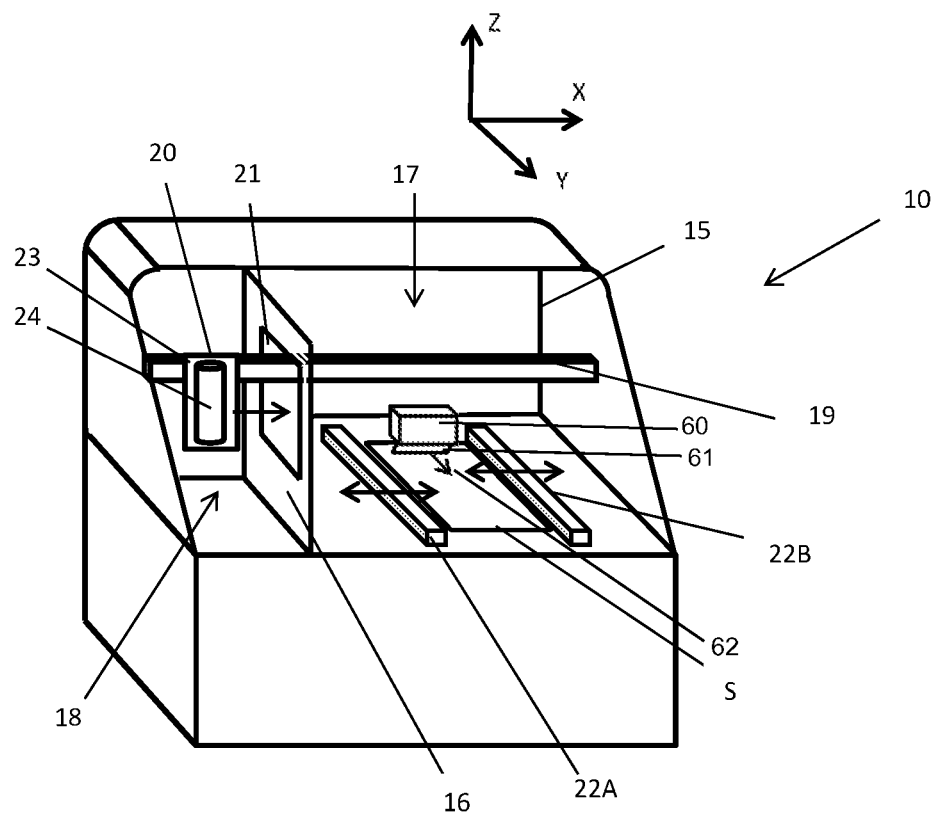
FIG. 3 schematically shows the printing machine of FIG. 2 with the hood and door removed.

FIG. 3 shows both schematically and not to scale the printing machine 10 of FIG. 1 from the same viewpoint, though with the hood 12 and door 13 removed for clarity. In addition, and again for clarity, much of the printing machinery, is omitted. The housing 11, and printing machinery and components are supported by frame 15. The internal volume of the printing machine 10 is partially separated into two distinct subvolumes by an internal partition 16: a main volume 17 and a container exchange volume 18, which is smaller than the main volume 17. The main volume 17 accommodates the printing machinery, including a print carriage 60 with squeegee 61. Chases 22A, 22B are shown within the main volume 17, these chases 22A, 22B provide a receptacle for a printing screen S in use. As is known generally in the art, such chases are movable by actuators (not shown) to adjust the distance therebetween, so that a variety of differently-sized printing screens may be held by the chases 22A, 22B in use. During a printing process, a print carriage 60, including a squeegee 61, travels over the receptacle in a direction of travel 62 to act on a stencil S retained within, the direction of travel 62 being parallel to the axes of the chases 22A, 22B, this direction conventionally being referred to as the "Y-direction".

The separation between the main volume 17 and the container exchange volume 18 is only partial since partition 16 includes an aperture 21, which permits communication between the two subvolumes. Passing through the aperture 21 proximate the upper edge thereof is a rail 19. Rail 19 extends at least partially across and over the receptacle, and in this embodiment across substantially the width of the printing machine 10, in a direction conventionally being referred to as the "X-direction". Rail 19 is statically fixed relative to the frame 15.

As will be described in detail below, the rail 19 is provided with a shuttle 23 mounted for travel along the rail 19. A portion of the rail 19, proximate an end thereof and located in the container exchange volume 18, acts both as a "home" position 20 for shuttle 23, in which the shuttle 23 may rest between dispensing actions, and an "exchange" position, in which the print medium container (25, see FIG. 4) may be exchanged, as will be described in more detail below. A cradle 24 is mounted on the shuttle 23 for travel therewith. Cradle 24 is adapted to retain a container for print medium (not shown). This container could for example comprise a cartridge or paste pot. It can be seen that shuttle 23 and cradle 24 are sized so as to fit through the aperture 21, so that they may travel into the main volume 17, and along the length of rail 19.

Figure 4:
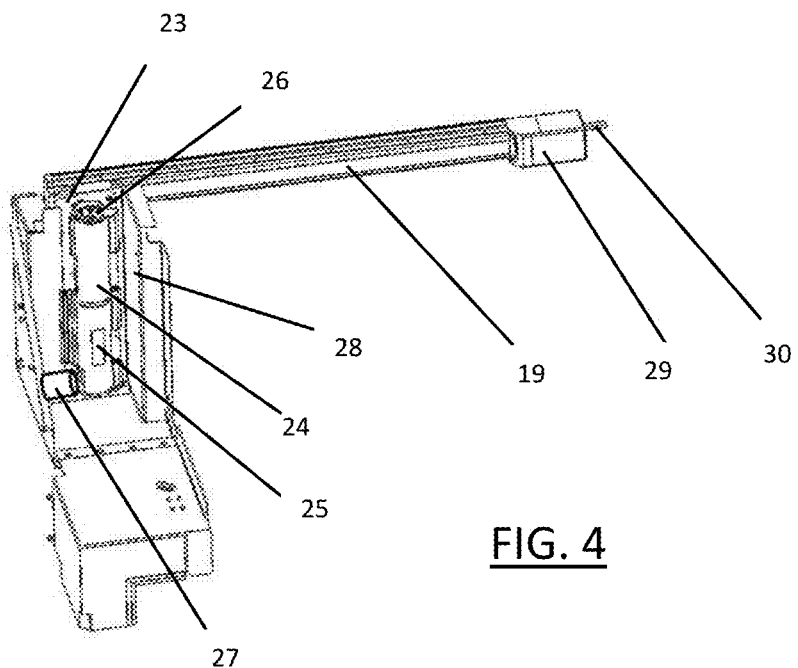
FIG. 4 schematically shows a portion of the printing machine of FIG. 2 with the shuttle at the home position.

FIG. 4 schematically shows, in a perspective view, a portion of the printing machine 10 of FIG. 2 with the shuttle 23 at the home position. More specifically, FIG. 4 shows the rail 19 with the shuttle 23 mounted thereon, with cradle 24 mounted on the shuttle 23. A paste cartridge 25 is located and securely retained within the cradle 24. The top of cradle 24 is open, so that a pneumatic line (not shown) can be fitted to a pneumatic connector 26 at the top of the paste cartridge 25. Supplying pressurised air through the pneumatic line and connector 26 will cause paste to be dispensed from the lower end of the paste cartridge 25. A printing medium sensor 27 is provided within the container exchange volume 18 so that it is proximate the lower end of a paste cartridge 25 when present in the cradle 24, and when the shuttle 23 is at the home position 20. The printing medium sensor 27 is operative to detect the presence of paste at the lower end of the paste cartridge 25 and output a simple YES/NO signal dependent on the determination of the presence of paste.

The shuttle 23 comprises a wall section 28 at a lateral side of the cradle 24 furthest from the home position 20. The wall section 28 projects from the shuttle 23 towards the front of the printing machine 10, and is dimensioned so as to conform to the aperture 21, and furthermore located so as to align with the partition 16. In this way, when the shuttle 23 is at the home position 20, the cradle 24 is located in the container exchange volume 18 and the wall section 28 aligns with the partition 16 to isolate the container exchange volume 18 from the main volume 17.

The rail 19 is provided with a programmable actuator 29 for moving the shuttle 23 along the rail 19. In this embodiment the rail 19 comprises a linear worm (not shown) selectively rotated by actuator 29, which drives the shuttle 23 along the rail as would be well understood by those skilled in the art. A pneumatic input 30 is provided to the rail 19, which connects to a pneumatic line (not shown) which runs along the rail 19 and connects to the shuttle 23. This pneumatic drive is used to effect vertical movement of the cradle 24 as will be described in more detail below, this vertical direction conventionally being referred to as the "Z-direction".

When the shuttle 23 is at the home position 20 as shown, so that it is in the container exchange volume 18, the container exchange volume 18 is isolated from the main volume 17. It is possible for an operator to open the door 13 to access the container exchange volume 18, remove cartridge 25 from cradle 24 and exchange it with a fresh cartridge which can be placed in the cradle 24, all without having to open the hood 12. In this way the cartridge can be exchanged without interrupting the printing cycle, in complete safety for the operator. The need to exchange a cartridge is determined by the output from the printing medium sensor 27.

Figure 5:
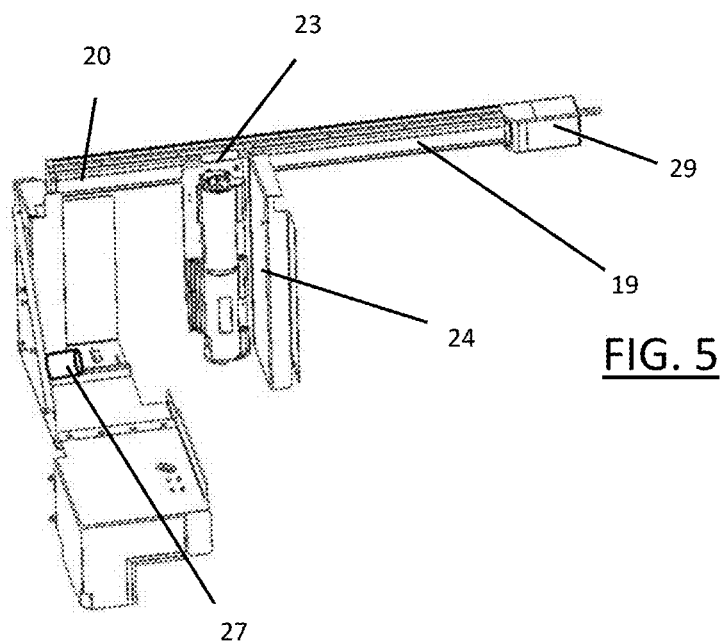
FIG. 5 is similar to FIG. 4, with the shuttle moving to a dispensing position.

FIG. 5 is a similar view to FIG. 4, however in this case the shuttle 23 is shown moving to a dispensing position. Actuator 29 is caused to drive the linear worm to cause the shuttle 23 to move along the rail 19, through aperture 16, out of the container exchange volume 18 and into the main volume 17. It can be seen that the wall section 28 travels with the shuttle 23. It should be noted that with the cradle 24 in this configuration, the shuttle 23, cradle 24 and cartridge 25 can pass over the top of chase 22A (and indeed chase 22B if travel continues along the rail 19) to reach a position over the printing screen. However, to dispense printing medium properly, the cartridge 25 must be closer to the printing screen. To achieve this, the cradle 24 is adapted to be vertically movable with respect to the shuttle 23, so that it can be lowered into a dispensing position. The vertical position of the cradle 24 is controlled pneumatically, with the pneumatic input 30.

Figure 6:
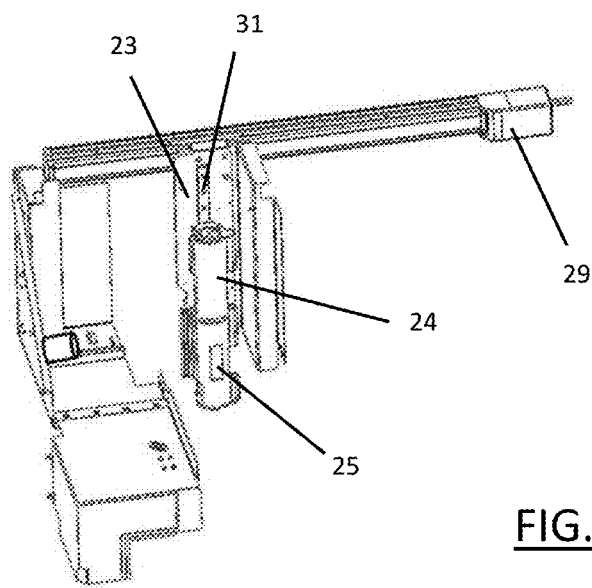
FIG. 6 is similar to FIG. 5, with the shuttle in a dispensing position.

FIG. 6 is a similar view to FIG. 5, with the cradle 24 in its lowered dispensing position. The cradle 24 is mounted on shuttle 23 via a linear track 31, which guides the vertical motion. For the avoidance of doubt, when the cradle 24 is at this lowered position to achieve satisfactory dispensing, it is unable to travel past either chase 22A, 22B without collision. Once in this lowered position a dispensing action may commence, during which the shuttle 23, and hence also cradle 24 and cartridge 25, is moved along the rail 19 by driving actuator 29, while pneumatic pressure is applied to pneumatic connector 26, causing a bead or line of paste to be dispensed onto the printing screen S (see FIG. 3). Following completion of dispensing, the pneumatic pressure to pneumatic connector 26 is switched off, the cradle 24 is raised and the shuttle 23 is moved back to the home position 20 by actuator 29. Once the shuttle has reach the home position 20, printing of a workpiece through the printing screen S can be performed as is well-known in the art.

Actuator 29 and the pneumatic drive are programmable so as to accommodate the chases 22A, 22B being set at different positions in the X-direction, and in particular to raise or lower the cradle 24 at preselected points of travel of the shuttle 23 along the rail 19. A control processor (not shown) is provided for controlling the actuator 29, the pneumatic supply for cradle 24 and the pneumatic supply for the cartridge 25 as required.

Figure 7:
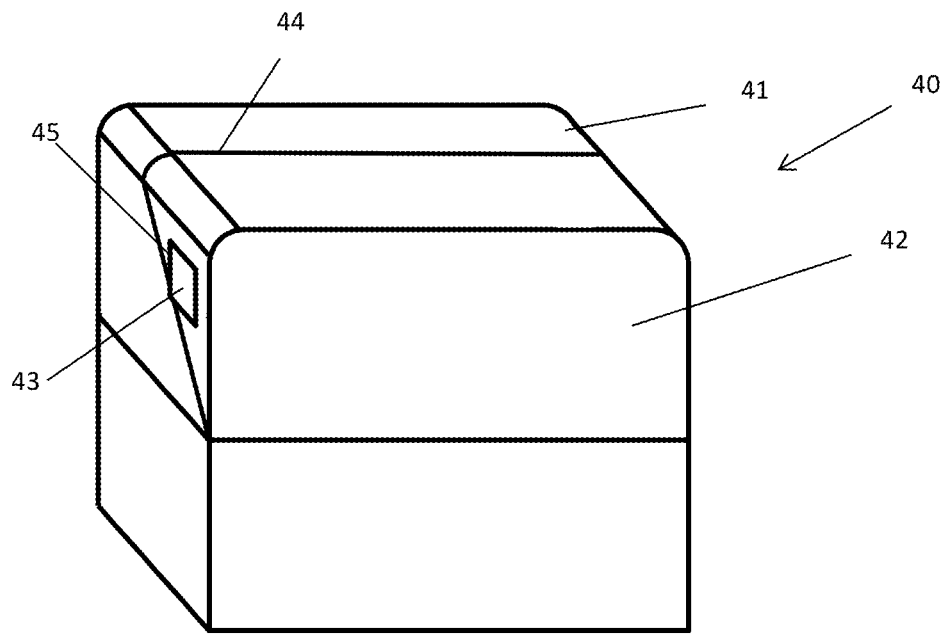
FIG. 7 schematically shows a perspective view of a closed printing machine in accordance with a second embodiment of the present invention.

FIG. 7 schematically shows a perspective view of a closed printing machine 40 in accordance with a second embodiment of the present invention. The external shape of the printing machine 40 is similar to that of the printing machine 10 shown in FIG. 2, in particular housing 41 is very similar to housing 11. In this embodiment however, hood 42 and its connecting hinge 44 extend across the entirety of the front width of the printing machine 40. A lateral side of the hood 42 is provided with a hatch 43, which is mounted on hood 42 by a hinge 45, to open outwardly.

Figure 8:
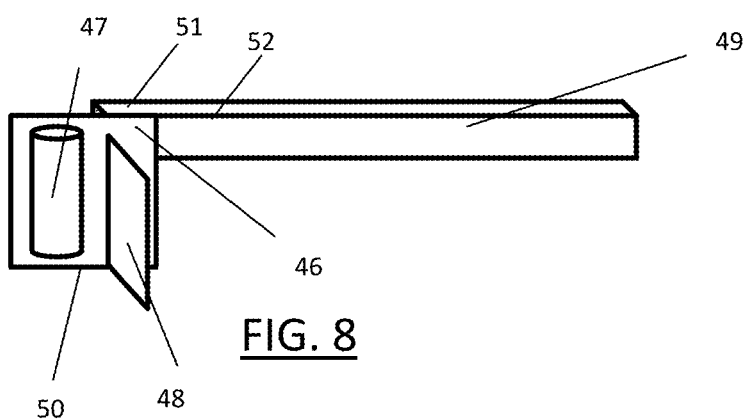
FIG. 8 schematically shows part of the internal configuration of the printing machine of FIG. 7.

FIG. 8 schematically shows, in perspective view, part of the internal configuration of the printing machine of FIG. 7. In particular, FIG. 8 shows certain major components of the print medium dispensing system. A statically-fixed rail 49 is provided which extends across substantially the entire internal width of the printing machine 40. A shuttle 46 is mounted for travel along the rail 49, so as to traverse a printing screen (not shown) in use. As with the first embodiment, the shuttle 46 carries a cradle 47 for retaining a print medium container (not shown), and a wall section 48 which projects perpendicularly to the rail 49. However, in this second embodiment, the cradle 47 is mounted on a projection 50 of the shuttle 46, which extends past the end of the rail 49 when the shuttle 46 is at an exchange position 51 proximate that end of the rail 49. The rail 49 and hatch 43 are aligned, so that when the shuttle 46 is moved along the rail 49 to the home position 52, the projection 50 abuts against and pushes open the hatch 43 from the inside of the printing machine 40, and passes to the outside of the printing machine 40. The cradle 47 therefore projects through the hatch 43, and outside the external housing 41. Wall section 48 then aligns with the external lateral surface of the external housing 41, providing at least partial isolation between the interior of the external housing 41 and the cradle 47. In this position, an operator may safely access the cradle to exchange the paste medium container, without interrupting the printing process. It will be apparent to those skilled in the art that a pneumatic line (not shown) will still be attached to the top of the print medium container within cradle 47, and which passes into the interior of the printing machine 40. To accommodate this pneumatic line, the wall section 48 is dimensioned to leave a gap between the wall section 48 and the hood 45, this gap being suitable for receiving the pneumatic line. As shown, the wall section 48 has a shorter dimension alone the Z-direction than the hatch 43, so that here a gap is formed above the wall section 48.

It can be seen that with this second embodiment, no internal partition is required. Those skilled in the art will also appreciate that in order to avoid unnecessary opening of the hatch 43, between dispensing actions the shuttle 46 should in general return to a home position 52 located between the exchange position 51 and that part of the rail 49 which overlies the printing screen in use. Movement of the shuttle 46 to the exchange position would only be performed when a paste sensor (not shown) determines that the print medium container is empty.

The above-described embodiments are exemplary only, and other possibilities and alternatives within the scope of the invention will be apparent to those skilled in the art. For example, in the embodiment described above, the rails 19, 49 comprise linear worms driven by an actuator 29. Other drive systems are of course possible. Similarly, while the vertical movement of cradles 24, 47 described above uses a pneumatic system, other drive systems, for example electromechanical drive systems, may alternatively be used. While the above-described embodiment shows the use of a paste cartridge, other containers, such as paste pots, and indeed other print media, such as conductive ink, may equally be dispensed.

With respect to the second embodiment, shown in FIGS. 7 and 8, the hatch 43 could be opened in a variety of ways, for example by way of a dedicated actuator, or manually opened by an operator.

It is possible that other equipment could be mounted for travel on the statically-fixed rail either in tandem or independently to the shuttle, such as, for example, a camera or other inspection equipment.

REFERENCE NUMERALS

1—Printing machine
2—Housing
3—Hood
4—Hinge
10, 40—Printing machine
11, 41—Housing
12, 42—Hood
13—Door
14, 44—Hinge
15—Frame
16—Partition
17—Main volume
18—Container exchange volume
19, 49—Rail
20, 52—Home position
21—Aperture
22A, 22B—Chases
23, 46—Shuttle
24, 47—Cradle
25—Paste cartridge
26—Pneumatic connector
27—Printing medium sensor
28, 48—Wall section
29—Actuator
30—Pneumatic input
31—Linear track
43—Hatch
45—Hatch hinge
50—Projection
51—Exchange position
60—Print carriage
61—Squeegee
62—Print carriage direction of travel
S—Screen

The invention claimed is:

1. A printing machine for printing a print medium onto a workpiece, comprising:
a frame,
an external housing supported by the frame,
a receptacle for receiving a printing screen in use,
a print carriage with squeegee operable to travel over the receptacle in a first direction,
a rail extending at least partially across and over the receptacle in a second direction orthogonal to the first direction,
a shuttle mounted for travel along the rail, and
a cradle adapted to retain a container for print medium, the cradle being mounted on the shuttle,
wherein the rail is statically fixed relative to the frame and a portion of the rail comprises an exchange position for the shuttle, at which position a container for printing medium can be placed in or removed from the cradle, the cradle being separated from the print carriage.

2. The printing machine of claim 1, comprising an internal partition which partially separates the interior of the printing machine into a main volume which comprises the receptacle, and a container exchange volume in which the exchange position is located.

3. The printing machine of claim 2, wherein the shuttle comprises a wall section, the wall section being provided at a lateral side of the cradle, such that when the shuttle is at the exchange position, the cradle is located in the container exchange volume and the wall section aligns with the partition to isolate the container exchange volume from the main volume.

4. The printing machine of claim 2, wherein the housing comprises a door located proximate the container exchange volume, to provide access to the cradle when the shuttle is at the exchange position.

5. The printing machine of claim 1, wherein the external housing comprises a hatch.

6. The printing machine of claim 5, wherein when the shuttle is at the exchange position, the cradle projects through the hatch and outside the external housing.

7. The printing machine of claim 6, wherein the shuttle comprises a wall section, the wall section being provided at a lateral side of the cradle, such that when the shuttle is at the exchange position, the cradle is located externally of the external housing and the wall section aligns with the external housing to isolate the cradle from the interior of the housing.

8. The printing machine of claim 1, comprising an actuator for moving the shuttle along the rail.

9. The printing machine of claim 1, wherein the cradle is movable in a vertical direction relative to the shuttle.

10. The printing machine of claim 9, comprising a drive to effect vertical movement of the cradle.

11. The printing machine of claim 10, wherein the drive comprises a pneumatic drive.

12. The printing machine of claim 10, wherein the drive is programmable to raise or lower the cradle at preselected points of travel of the shuttle along the rail.

* * * * *